United States Patent
Liaw

(10) Patent No.: US 9,251,888 B1
(45) Date of Patent: Feb. 2, 2016

(54) SRAM CELLS WITH VERTICAL GATE-ALL-ROUND MOSFETS

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/486,242

(22) Filed: Sep. 15, 2014

(51) Int. Cl.
*G11C 11/419* (2006.01)

(52) U.S. Cl.
CPC .................. *G11C 11/419* (2013.01)

(58) Field of Classification Search
None
See application file for complete search history.

(56) References Cited

U.S. PATENT DOCUMENTS

| 2004/0113207 A1* | 6/2004 | Hsu ........... G11C 11/412 257/368 |
| 2010/0219483 A1* | 9/2010 | Masuoka ........ H01L 21/845 257/369 |

* cited by examiner

Primary Examiner — James G Norman
(74) Attorney, Agent, or Firm — Slater & Matsil, L.L.P.

(57) ABSTRACT

A Static Random Access Memory (SRAM) cell includes a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate as a second source/drain region. A first isolated active region is in the SRAM cell and acts as the bottom plate of the first pull-down transistor and the bottom plate of the first pass-gate transistor. A second isolated active region is in the SRAM cell and acts as the bottom plate of the second pull-down transistor and the bottom plate of the second pass-gate transistor.

20 Claims, 15 Drawing Sheets

US 9,251,888 B1

SRAM CELLS WITH VERTICAL GATE-ALL-ROUND MOSFETS

BACKGROUND

Static Random Access Memory (SRAM) is commonly used in integrated circuits. SRAM cells have the advantageous feature of holding data without a need for refreshing. With the increasingly demanding requirement to the speed of integrated circuits, the read speed and write speed of SRAM cells also become more important. Furthermore, the parasitic capacitance of the Metal-Oxide-Semiconductor Field-Effect Transistors (MOSFETs) in the SRAM needs to be very low to suit for the high-speed SRAM cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
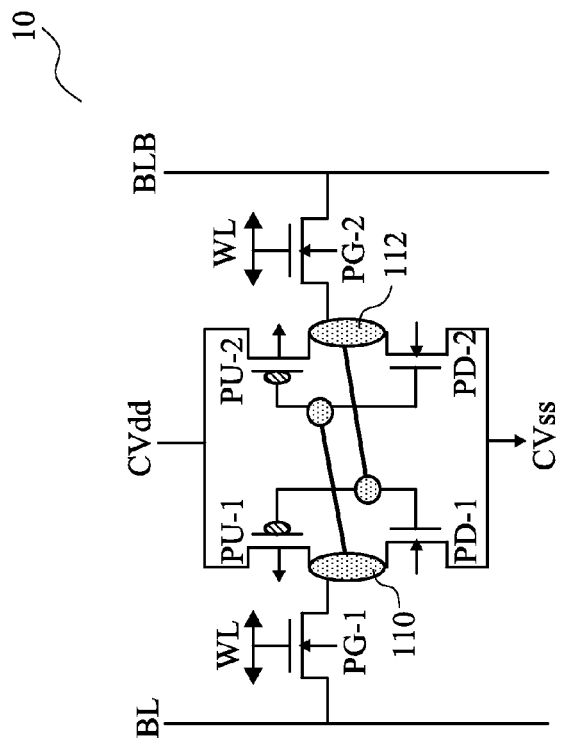
FIGS. 1 and 2 are circuit diagrams of a Static Random Access Memory (SRAM) cell comprising n-type pass-gate transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random Access Memory (SRAM) cells comprising Vertical Gate-All-Around (VGAA) transistors are provided in accordance with various exemplary embodiments. Some variations of the embodiments are discussed. Throughout the various views and illustrative embodiments, like reference numbers are used to designate like elements.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. Pass-gate transistors PG-1 and PG-2 are N-type transistors in accordance with some embodiments. The gates of pass-gate transistors PG-1 and PG-2 are connected to, and controlled by, word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in storage node 110 and storage node 112. The stored bit can be written into, or read from, SRAM cell 10 through Bit-line line (BL) and Bit-Line Bar (BLB), wherein BL and BLB may carry complementary bit-line signals. SRAM cell 10 is powered through a positive power supply node CVdd that has a positive power supply voltage (also denoted as CVdd). SRAM cell 10 is also connected to power supply node/voltage CVss, which may be an electrical ground.

The sources of pull-up transistors PU-1 and PU-2 are connected to power supply voltage/node CVdd. The sources of pull-down transistors PD-1 and PD-2 are connected to power supply voltage/node CVss. The gates of transistors PU-1 and PD-1 are connected to the drains of transistors PU-2 and PD-2, which connection node is storage node 112. The gates of transistors PU-2 and PD-2 are connected to the drains of transistors PU-1 and PD-1, which connection node is storage node 110. The source region of pass-gate transistor PG-1 is connected to Bit-line BL at a Bit-line node, and the drain region of pass-gate transistor PG-1 is connected to storage node 110. The source region of pass-gate transistor PG-2 is connected to Bit-line BLB at a Bit-line node, and the drain region of pass-gate transistor PG-2 is connected to storage node 112.

Figure 2:
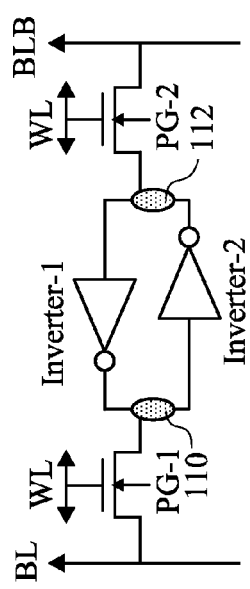

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
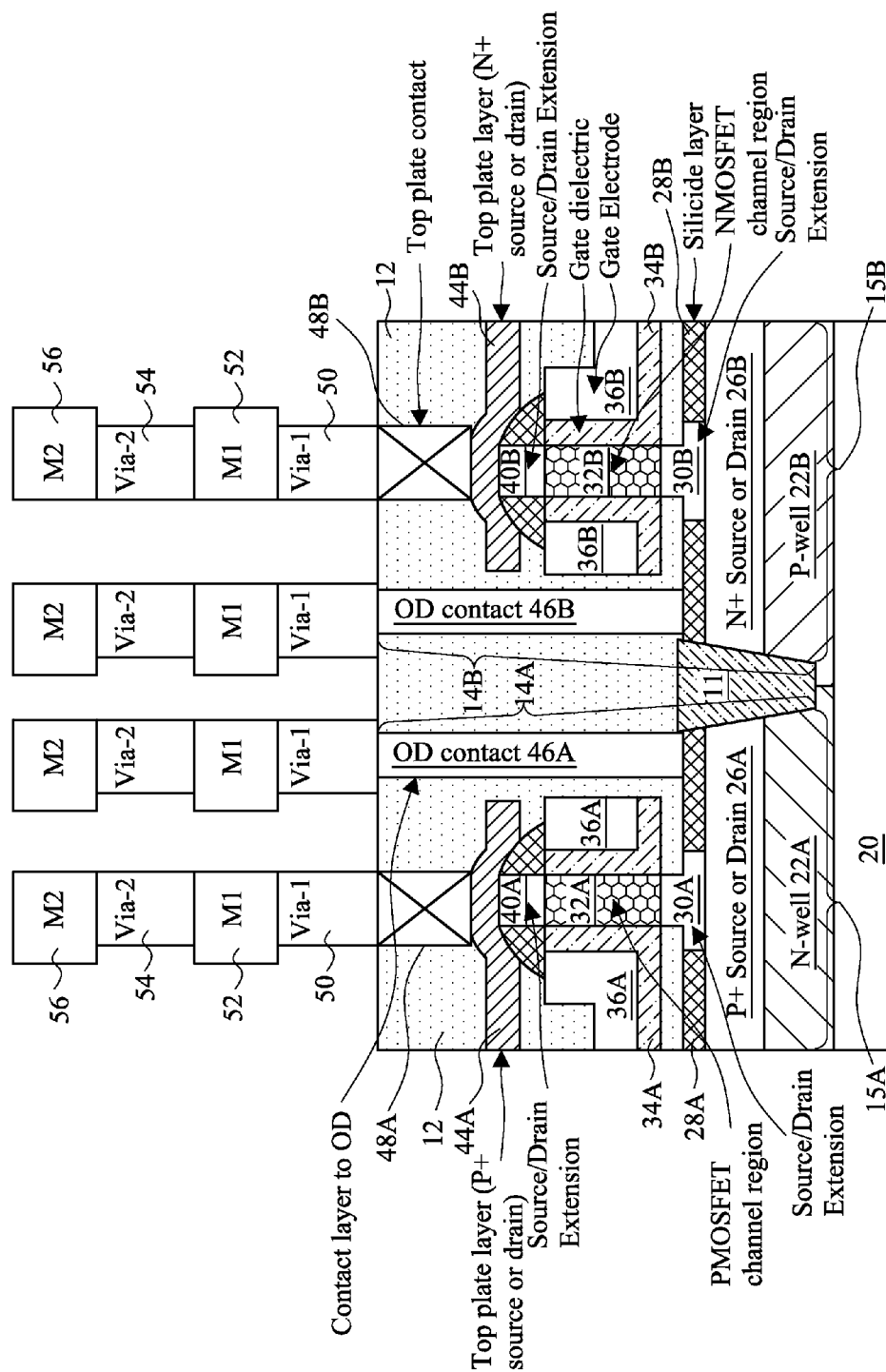
FIG. 3 is a cross-sectional view of an n-type and a p-type Vertical Gate-All-Around (VGAA) transistor in accordance with some embodiments.

FIG. 3 illustrates a cross-sectional view of exemplary VGAA transistors including p-type VGAA transistor 14A and n-type VGAA transistor 14B in accordance with some embodiments. VGAA transistors 14A and 14B have vertical channels, and gate dielectrics and gate electrodes form full rings encircling the respective vertical channels. Furthermore, in a VGAA transistor, one of the source/drain regions is over the respective channel, and the other one of the source/drain regions is underlying the respective channel. Shallow Trench Isolation (STI) regions 11 define portions of the semiconductor regions (such as N-well 22A, P-well 22B, and/or semiconductor substrate 20) as a plurality of active regions (also referred to as OD regions). In some embodiments, the OD regions are higher than the bottom surfaces of STI regions 11. For example, in FIG. 3, active regions 15 (such as 15A and 15B) are illustrated. VGAA transistors 14A and 14B are formed based on active regions 15A and 15B, respectively.

P-type VGAA transistor 14A includes a first source/drain (P+) region 26A over and in contact with N-well 22A, and silicide region 28A over P+ source/drain region 26A. P+ region 26A and silicide region 28A are in combination referred to as the bottom plate of transistor 14A. In some embodiments, source/drain extension region 30A, which may be a P+ region, is formed over source/drain region 26A. Throughout the description, source/drain extension regions are also referred to as Lightly-Doped Drain (LDD) regions, although they may be lightly doped (for example, with doping concentrations lower than about $1E17/cm^3$, represented as "P-"), heavily doped (for example, with doping concentrations higher than about $1E21/cm^3$, represented as "P+"), or moderately doped (for example, with doping concentrations between about $1E17/cm^3$ and about $1E21/cm^3$, represented as "P"). Channel region 32A, which is an n-type semiconductor region, is a vertical channel formed over source/drain extension region 30A. Gate dielectric 34A encircles channel region 32A, and may be formed of silicon oxide, silicon nitride, a high-k dielectric material(s), combinations thereof, or multi-layers thereof. Gate electrode 36A, which may be formed of polysilicon or another conductive material such as a metal, a metal alloy, a metal silicide, etc., is formed to encircle gate dielectric 34A. LDD region 40A is formed over channel region 32A. Top plate 44A, which is a conductive layer formed of polysilicon, silicide, a metal, a metal alloy, or the like, is formed over LDD region 40A. Top plate 44A acts as the second source/drain region of VGAA transistor 14A.

N-type VGAA transistor 14B includes a first source/drain (N+) region 26B over and in contact with P-well 22B, and silicide region 28B over N+ source/drain region 26B. N+ region 26B and silicide region 28B are in combination referred to as the bottom plate of transistor 14B. In some embodiments, source/drain extension region 30B, which may be an N+ region, an N region or an N− region, is formed over source/drain region 26B. Channel region 32B, which is a p-type semiconductor region, is a vertical channel over source/drain extension region 30B. Gate dielectric 34B encircles channel region 32B. Gate electrode 36B, which may be formed of polysilicon or another conductive material such as a metal, a metal alloy, a metal silicide, etc., is formed to encircle gate dielectric 34B. N+/N/N− LDD region 40B is formed over channel region 32B. Top plate 44B, which is a conductive layer formed of polysilicon, silicide, a metal, a metal alloy, or the like, is formed over LDD region 40B. Top plate 44B acts as the second source/drain region of VGAA transistor 14B.

Top plate contacts 48 (such as 48A and 48B) are formed over and electrically connected to top plates 44A and 44B, respectively. OD contacts 46A and 46B are connected to the bottom plates (source/drain regions) 28A/26A and 28B/26B, respectively. VGAA transistors 14A and 14B are formed in dielectric layer 12, which may include a plurality of dielectric layers. The transistors PG-1, PG-2, PU-1, PU-2, PD-1, and PD-2 (FIG. 5) in the embodiments of the present disclosure may have the structures as shown in FIG. 3.

The interconnect structure connected to VGAA transistors 14A and 14B may include first level (referred to as via-1) vias 50. First level metal lines/pads (referred to as M1 lines/pads) 52 are over and connected to via-1 vias 50. Second level vias (referred to as via-2) 54 are over and connected to M1 lines/pads 52. Second level metal lines/pads (referred to as M2 lines/pads) 56 are over and connected to via-2 vias 54. Throughout the description, a sign followed by a number may be postfixed to reference notations 50, 52, 54, and 56 to further refer to individual vias and metal lines/pads.

Figure 4:
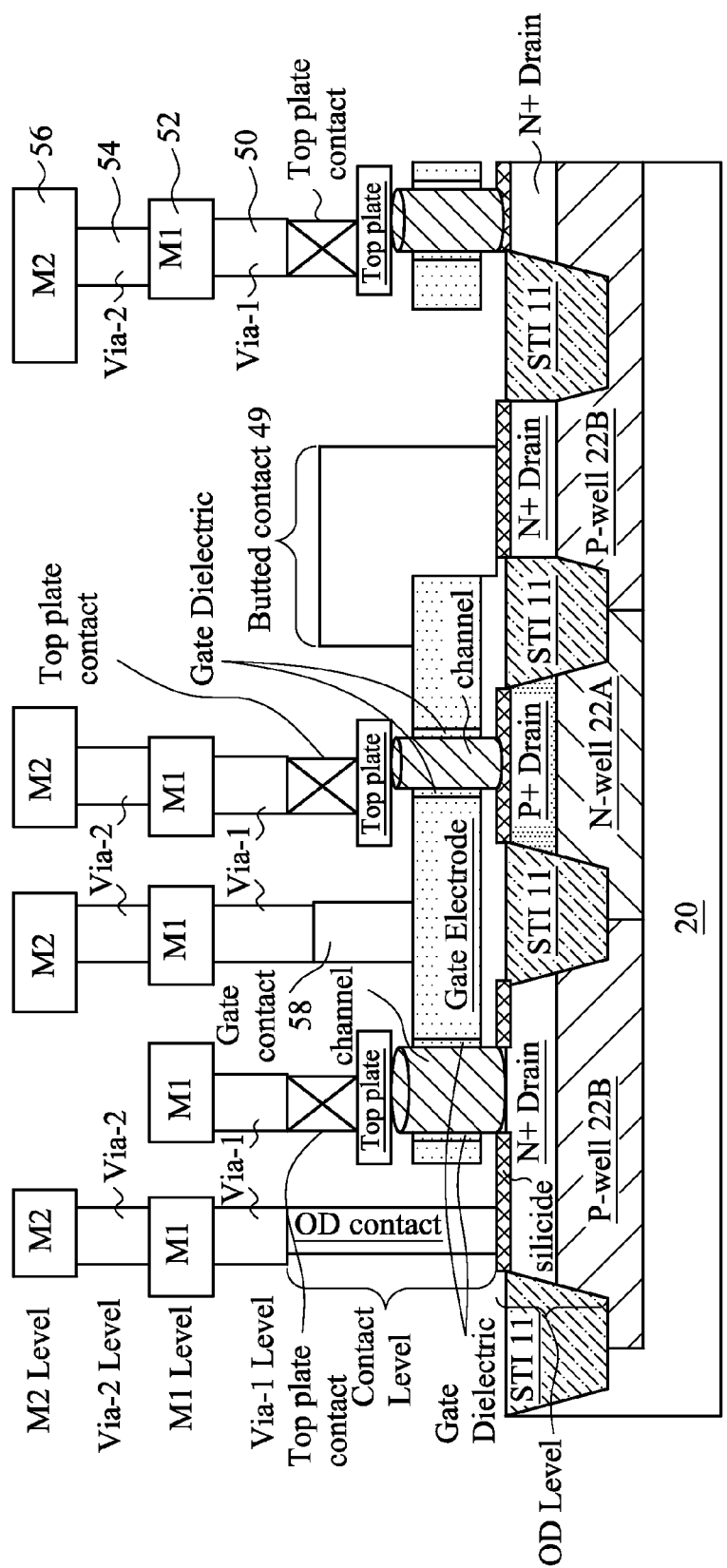
FIG. 4 illustrates a schematic cross-sectional view of various levels of VGAA transistors and the features in different levels in accordance with some embodiments.

FIG. 4 schematically illustrates the features and the respective levels discussed throughout the description. The features in FIG. 4 also correspond to the features in FIG. 3. Each of the levels and layers includes one or more dielectric layers and the conductive features formed therein. The conductive features that are at the same level may have top surfaces substantially level to each other, bottom surfaces substantially level to each other, and may be formed simultaneously. For example, there is an OD level, in which ODs (active regions) 15 (including 15A and 15B) are located. A "contact level" is over the OD level, wherein contact plugs are formed in the contact level. The features in the contact level include OD contacts (such as 46A and 46B in FIG. 3), top plate contacts (such as 48A and 48B in FIG. 3), gate contacts (such as 58 in FIG. 4), butted contacts (such as 49 in FIG. 4), etc. Over the contact level resides via-1 level, M1 level, via-2 level, and M2 level. In subsequent discussion, when features are discussed, their levels may be found referring to their names and their reference numerals in FIGS. 3 and 4. The reference numerals of the features throughout the description may be referred to using the reference numerals in FIGS. 3 and 4 followed by sign "−" and a number. For example, when a feature is denoted as 52 followed by sign "−" and a number, it indicates this feature is one of the features in the M1 level. When a feature is denoted as 15 followed by sign "−" and a number, it indicates that this feature is one of active regions.

FIG. 4 also includes butted contact 49, which includes a bottom surface landing on a gate electrode, and another bottom surface landing on an active region such as an N+ region, a P+ region, or the respective overlying silicide region (not shown). Furthermore, gate contact 58 is further illustrated. In the exemplary embodiment shown in FIG. 4, gate contact 58 lands on and electrically connected to a gate electrode, which is shared by two VGAA transistors.

Figure 5:
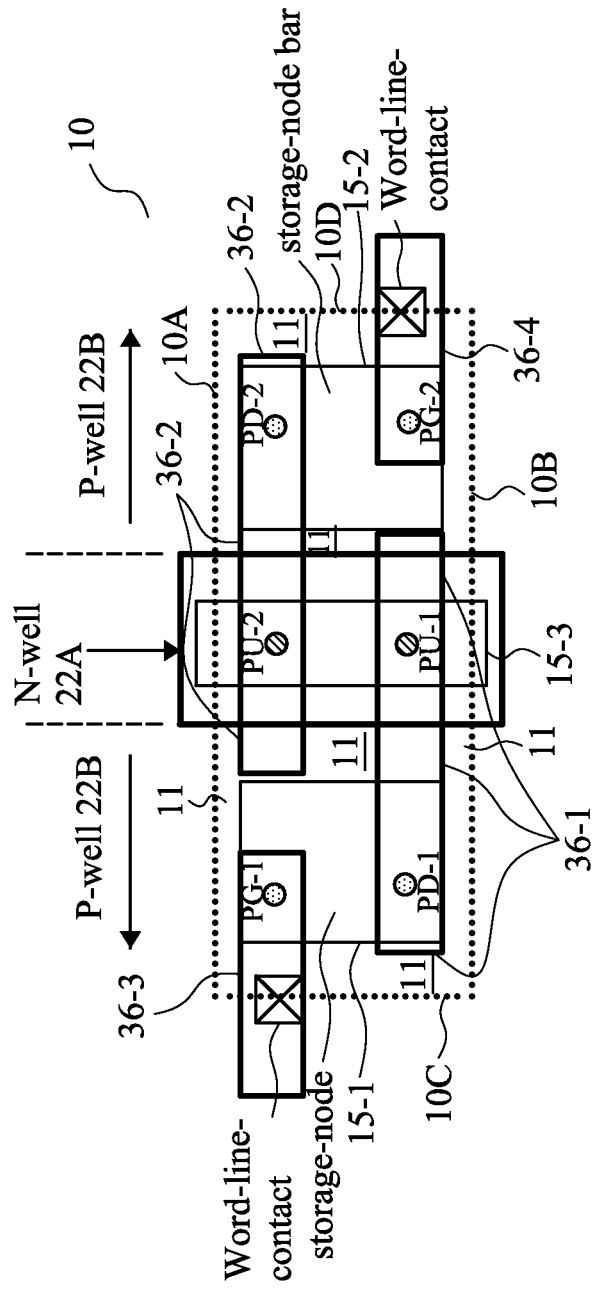
FIG. 5 is an exemplary layout of an SRAM cell in accordance with some embodiments.

FIG. 5 illustrates a layout of SRAM cell 10 in accordance with some exemplary embodiments. The outer boundaries 10A, 10B, 10C, and 10D of SRAM cell 10 are illustrated using dashed lines, which form a rectangle. SRAM cell 10 includes N-well 22A and two P-Wells 22B on the opposite sides of N-well 22A. SRAM cell 10 includes ODs 15 (including 15-1, 15-2, and 15-3), which are the active regions at the "OD level" as in FIG. 4. In some embodiments, in SRAM cell 10, there is no additional OD other than ODs 15-1, 15-2, and 15-3. Each of ODs 15-1 and 15-2 is an OD that is fully inside SRAM cell 10. For example, each of ODs 15-1 and 15-2 is spaced apart from the boundaries 10A, 10B, 10C, and 10D of SRAM cell 10, and is fully encircled by STI regions 11. Accordingly, each of ODs 15-1 and 15-2 is an OD that is isolated from all other ODs that are inside and/or outside of SRAM cell 10.

On the other hand, OD region 15-3 is a continuous OD that extends from boundary 10A to the opposite boundary 10B. When boundaries 10A and 10B are butted to the boundaries of neighboring SRAM cells, OD region 15-3 will be connected to the continuous ODs of the neighboring SRAM cells. Accordingly, the ODs in the present disclosure are different from the ODs in conventional SRAM cells. The ODs in the conventional SRAM cells include four ODs in each SRAM cell, with each of the ODs extending to a boundary of the SRAM cell and connected to an OD of a neighboring SRAM cell. OD region 15-3 is used as a power rail for conducting positive power supply voltage CVdd, and also acts as the source regions of transistors PU-1 and PU-2.

SRAM cell 10 includes transistors PG-1, PG-2, PU-1, PU-2, PD-1, and PD-2, with the channel regions of the transistors illustrated as circles. The circles represent the top-view shapes of the channel regions (refer to 32A and 32B in FIG. 3) of the transistors in accordance with some embodiments, wherein the channel regions may be nano-wires. The top-view shapes of the channel regions may have other shapes including, and not limited to, rectangular shapes, hexagonal shapes, triangular shapes, ellipses, or the like. Each of transistors PG-1, PG-2, PU-1, PU-2, PD-1, and PD-2 may have the structure shown in FIG. 3, depending on whether the transistor is a p-type or an n-type VGAA transistor. Accordingly, each of transistors PG-1, PG-2, PU-1, PU-2, PD-1, and PD-2 includes an OD as a bottom plate (and a first source/drain region), and a top plate as a second source/drain region.

Transistors PG-1 and PD-1 are formed on OD region 15-1, wherein OD region 15-1 forms the bottom plates, which are the drain regions (corresponding to regions 28B/26B in FIG. 3) of transistors PG-1 and PD-1. OD region 15-1 is shared by transistors PG-1 and PD-1 to act as the "storage node 110" as show in FIG. 1. The gate dielectrics that surround the respective channel regions are not shown. Transistors PG-2 and PD-2 are formed on OD region 15-2, wherein OD region 15-2 forms the bottom plates, which are the drain regions (corresponding to regions 28A/26A in FIG. 3) of transistors PG-2 and PD-2. OD region 15-2 is shared by transistors PG-2 and PD-2 to act as the "storage node 112" as show in FIG. 1. The gate dielectrics that surround the respective channel regions are not shown.

Gate electrode 36-1 is shared by, and encircles the channel regions of, transistors PD-1 and PU-1. Gate electrode 36-2 is shared by, and encircles the channel regions of, transistors PD-2 and PU-2. Gate electrode 36-3 encircles the channel region of transistor PG-1, and is electrically connected to a word-line contact as illustrated. Gate electrode 36-4 encircles the channel region of transistor PG-2, and is electrically to another word-line contact as illustrated.

Figure 6:
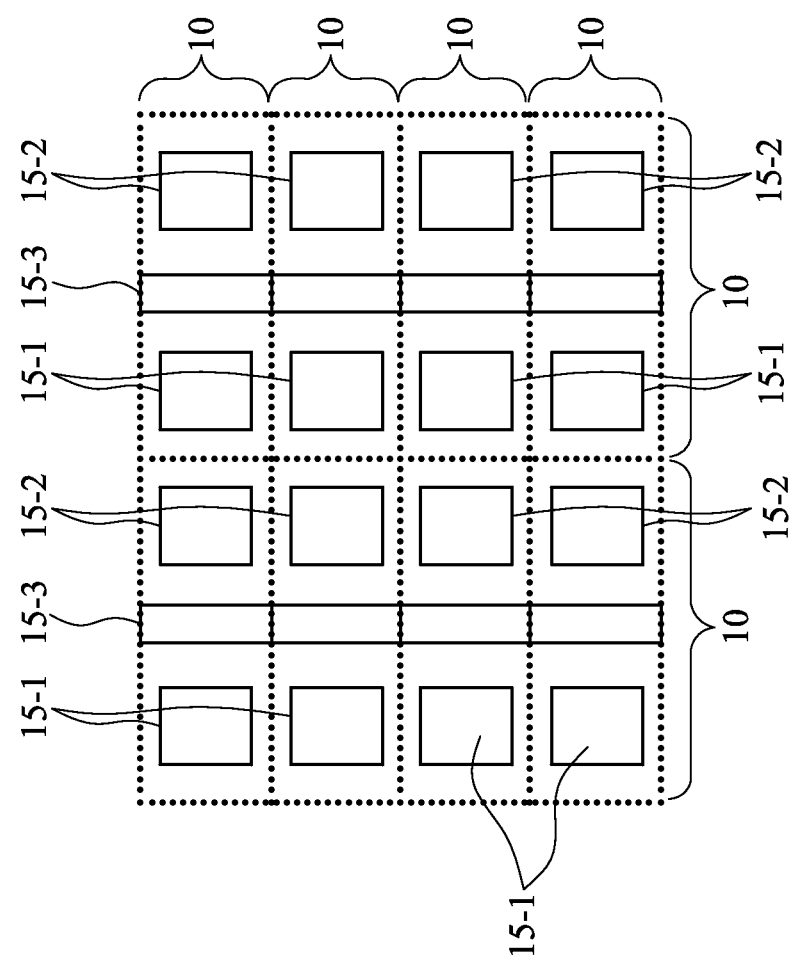
FIG. 6 illustrates an array of SRAM cells and the corresponding active regions in accordance with various embodiments.

FIG. 6 illustrates the layout of a plurality of SRAM cells 10 arranged as an array including a plurality of rows and columns, wherein neighboring SRAM cells 10 are butted. OD regions 15-3 form continuous OD regions, with each extending through a plurality of rows in accordance with some embodiments. OD regions 15-1 and 15-2, however, are isolated OD regions not joined with any other OD regions outside the respective SRAM cells.

Figure 7:
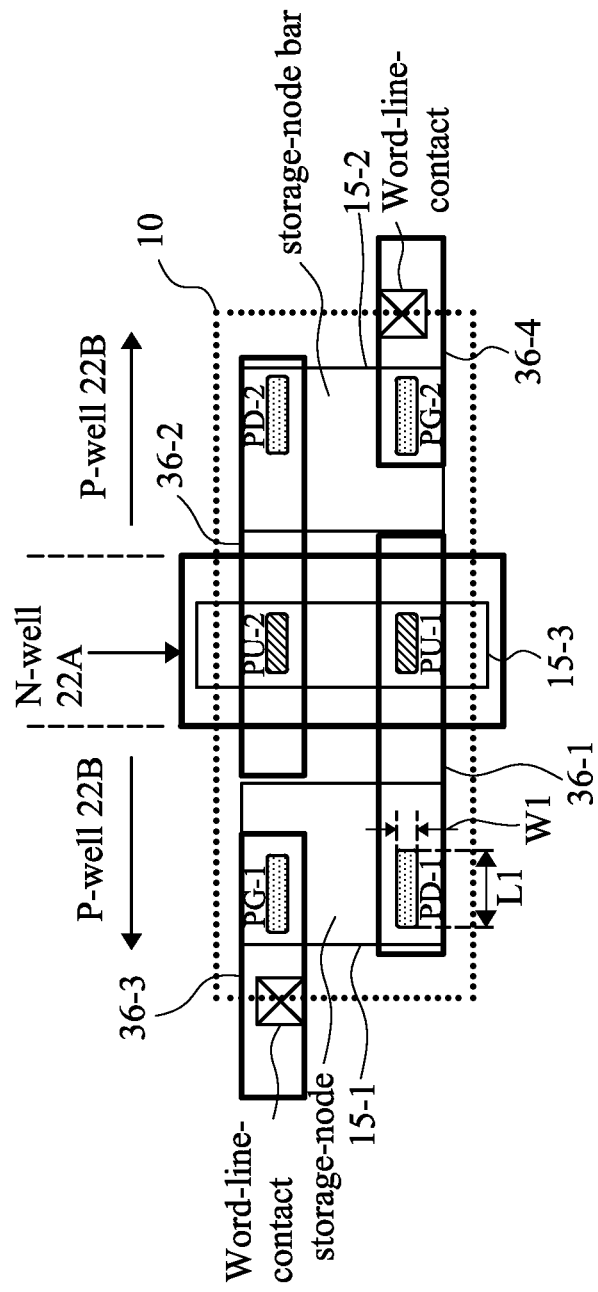
FIGS. 7 through 12 are the layouts of SRAM cells in accordance with exemplary embodiments.

FIG. 7 illustrates a layout of SRAM cell 10 in accordance with alternative embodiments of the present disclosure. These embodiments are similar to the embodiments in FIG. 5, except that the channel regions of transistors PG-1, PG-2, PU-1, PU-2, PD-1, and PD-2 are nano-bars having length L1 significantly greater than the respective widths W1. The increased length L1 results in an increased channel width, which is equal to 2(L1+W1), and hence the saturation currents of the transistors are high.

Figure 8:
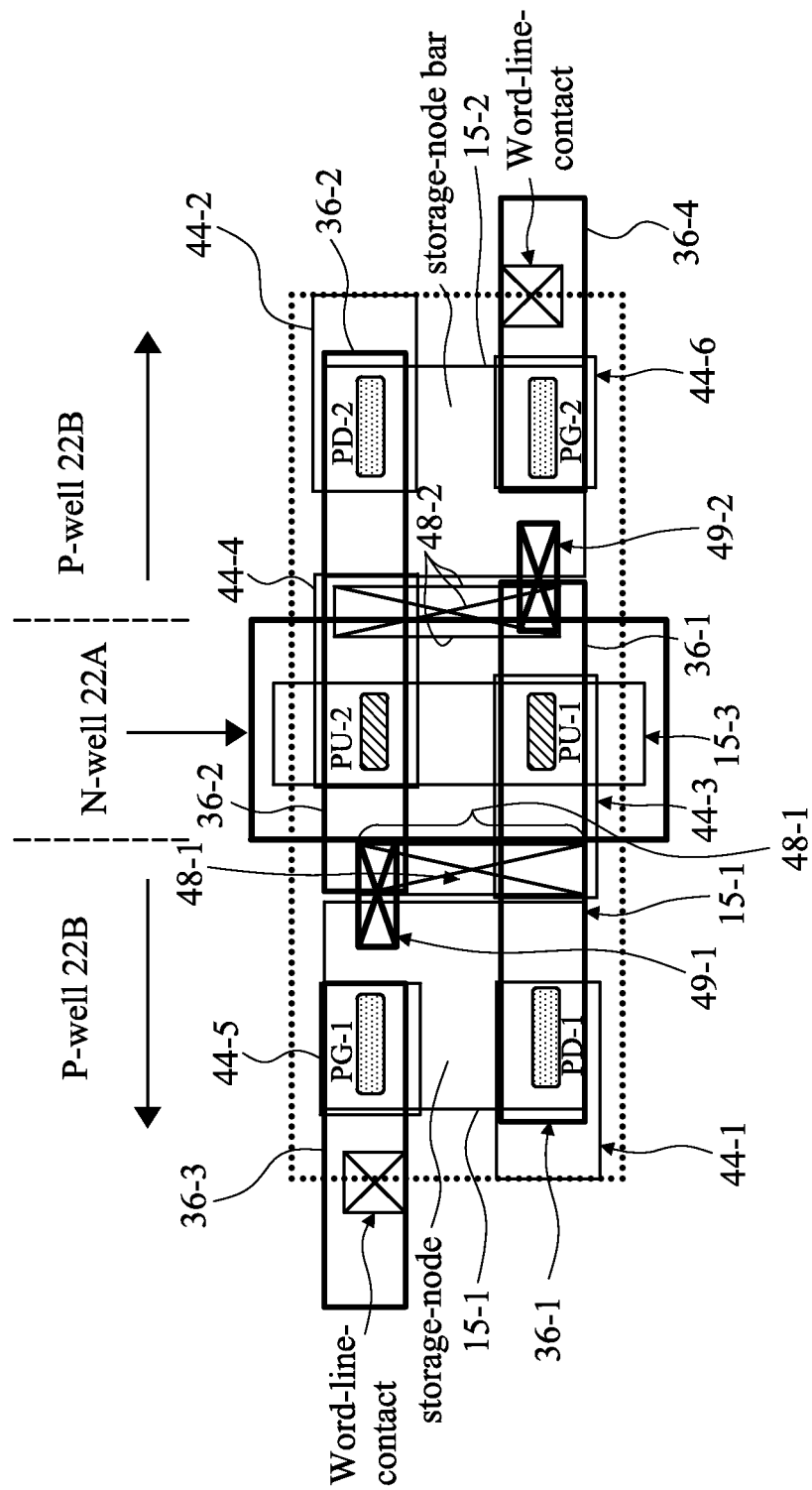

FIG. 8 illustrates the exemplary layout of SRAM cell 10, which is the same SRAM cell 10 as shown in FIG. 7, except additional features such as contacts and top plates (refer to the features in the "contact level" and the "top plate" in FIG. 4) are further illustrated in addition to the features shown in FIG. 7. FIG. 8 illustrates top plates 44-1, 44-2, 44-3, 44-4, 44-5, and 44-6, which are the top plates of transistors PD-1, PD-2, PU-1, PU-2, PG-1, and PG-2, respectively. The positions of the top plates 44-1, 44-2, 44-3, 44-4, 44-5, and 44-6 may be found referring to the positions of top plates 44A and 44B in FIG. 3. Top plate contacts 48-1 and 48-2 are also illustrated, wherein the positions of top plate contacts 48-1 and 48-2 may be found referring to the positions of top plate contacts 48A and 48B in FIG. 3. In addition, butted contacts 49-1 and 49-2 are also illustrated, wherein the shapes and the positions of butted contacts 49-1 and 49-2 may be found referring to the positions of the illustrated "butted contact 49" in FIG. 4.

As shown in FIG. 8, butted contact 49-1 electrically connects OD region 15-1 to gate electrode 36-2 of transistors PU-2 and PD-2, wherein the bottom surfaces of butted contact 49-1 land on OD region 15-1 and gate electrode 36-2. Top plate contact 48-1 further connects butted contact 49-1 to top plate 44-3 (the drain) of transistor PU-1. It is noted that although top plate contact 48-1 is illustrated as overlapping a portion of gate electrode 36-1, top plate contact 48-1 is physically and electrically disconnected from gate electrode 36-1 since top plate contact 48-1 lands on, and stops on, top plate 44-3, which separates top plate contact 48-1 apart from the underlying gate electrode 36-1. Accordingly, butted contact 49-1 and top plate contact 48-1 in combination connect the drain regions of transistors PG-1, PD-1, and PU1 to gate electrode 36-2 to form storage node 110 (refer to FIG. 1).

Furthermore, butted contact 49-2 electrically connect OD region 15-2 to gate electrode 36-1 of transistors PU-1 and PD-1, wherein the bottom surfaces of butted contact 49-2 land on OD region 15-2 and gate electrode 36-1. Top plate contact 48-2 further connects butted contact 49-2 to top plate 44-4 of transistor PU-2. It is noted that although top plate contact 48-2 is illustrated as overlapping a portion of gate electrode 36-2, top plate contact 48-2 is physically and electrically disconnected from gate electrode 36-2 since top plate contact 48-2 lands on top plate 44-4, which separates top plate contact 48-2 apart from the underlying gate electrode 36-2. Accordingly, butted contact 49-2 and top plate contact 48-2 in combination connect the drain regions of transistors PG-2, PD-2, and PU2 to the gate electrode 36-1 to form storage node 112 (refer to FIG. 1).

Figure 9:
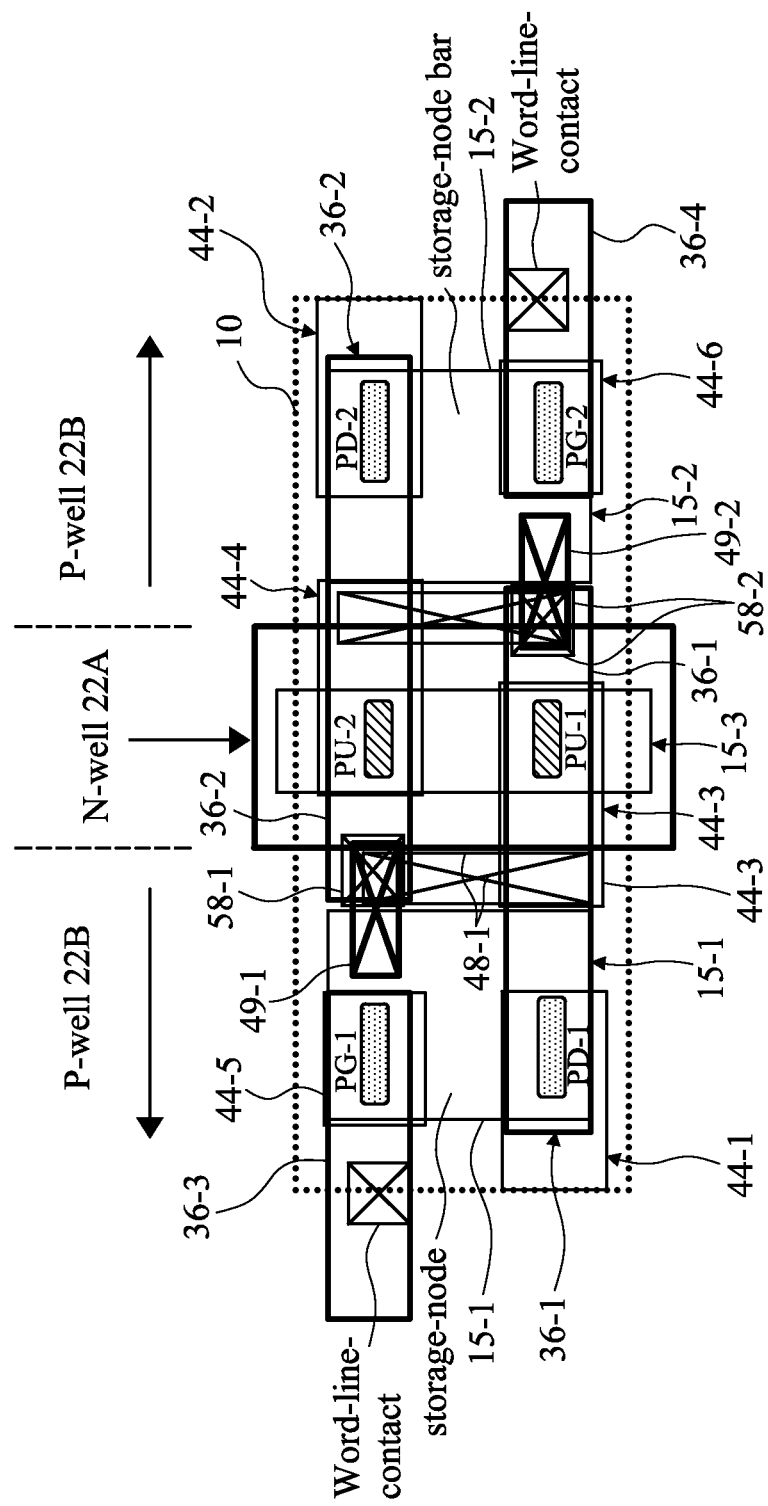

FIG. 9 illustrates the layout of SRAM cell 10 in accordance with some embodiments. These embodiments are similar to the embodiments shown in FIG. 8, except that butted contact 49-1 shown in FIG. 8 is replaced with gate contact 58-1 and butted contact 49-1. Gate contact 58-1 lands on gate electrode 36-2. Butted contact 49-1 has bottom surfaces landing on gate contact 58-1 and OD region 15-1. Top plate contact 48-1 further has a bottom surface (not shown in FIG. 9) landing on butted contact 49-1. Accordingly, butted contact 49-1, gate contact 58-1, and top plate contact 48-1 in combination connect the drain regions of transistors PG-2, PD-2, and PU2 to the gate electrode 36-1 to form storage node 110 (also refer to FIG. 1).

Similarly, as shown in FIG. 9, the butted contact 49-2 shown in FIG. 8 is replaced with gate contact 58-2 and butted contact 49-2. Gate contact 58-1 lands on gate electrode 36-1. Butted contact 49-2 has bottom surfaces landing on gate contact 58-2 and OD region 15-2. Top plate contact 48-2 further has a bottom surface (not shown in FIG. 9) landing on butted contact 49-2. Accordingly, butted contact 49-2, gate contact 58-2, and top plate contact 48-2 in combination connect the drain regions of transistors PG-1, PD-1, and PU1 to the gate electrode 36-2 to form storage node 112 (also refer to FIG. 1).

Figure 10:
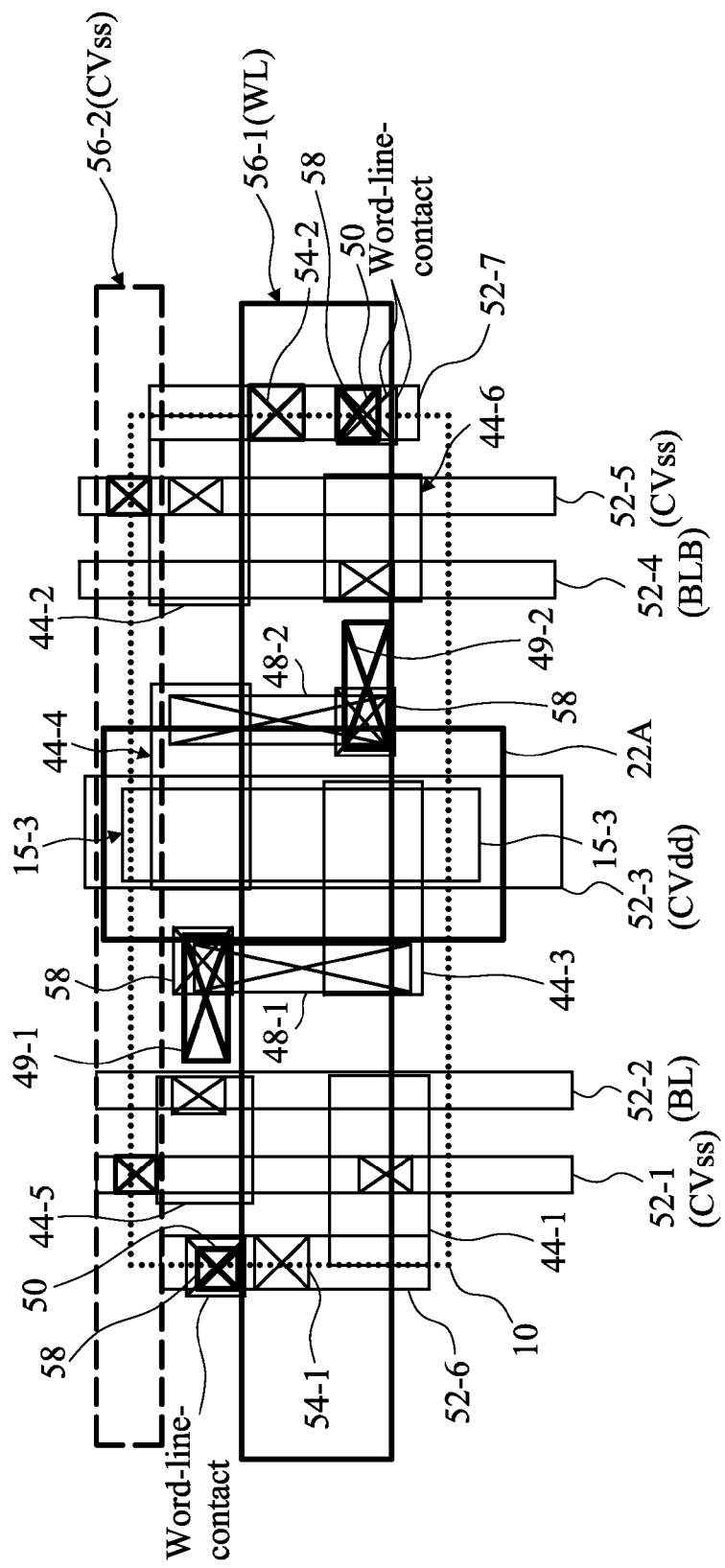

FIG. 10 illustrates more features in the layout of SRAM cell 10. The layout of SRAM cell 10 in FIG. 10 is similar to the layout of the SRAM cell in FIG. 9, except the transistors and the gate electrodes in SRAM cell 10 are not illustrated for clarity. Instead, metal lines and the respective vias are shown. Some of the un-marked features such as contacts, top plates, and the like may be found by comparing FIG. 10 to FIGS. 7-9. FIG. 10 illustrates M1 level metal lines such as 52-1 as a first CVss line, 52-2 as bit-line BL, 52-3 as CVdd line, 52-4 as bit-line bar BLB, and 52-5 as a second CVss line. M1 level metal lines 52-1, 52-2, 52-3, 52-4, and 52-5 extend in a first direction, which may be the column direction. Word-line 56-1 is provided at the M2 level (refer to FIG. 4), and extends in a second direction such as the row direction. In some embodiments, CVss line 56-2 is also provided as an M2 level feature, which is connected to M1 lines 52-1 and 52-5 through via-2 vias. In alternative embodiments, CVss line 56-2 is not formed. Each of the M2 level features and M1 level features are connected to the underlying features through vias, which are illustrated but not marked with references.

As shown in FIG. 10, word-line 56-1 is connected to the M1 level landing pads 52-6 and 56-7 through via-2 vias 54-1 and 54-2. Landing pads 52-6 and 52-7 are further connected to the underlying gate electrodes through via-1 vias 50 and gate contacts 58. In accordance with some embodiments, landing pads 52-6 and 52-7 have a strip shape.

Figure 11:
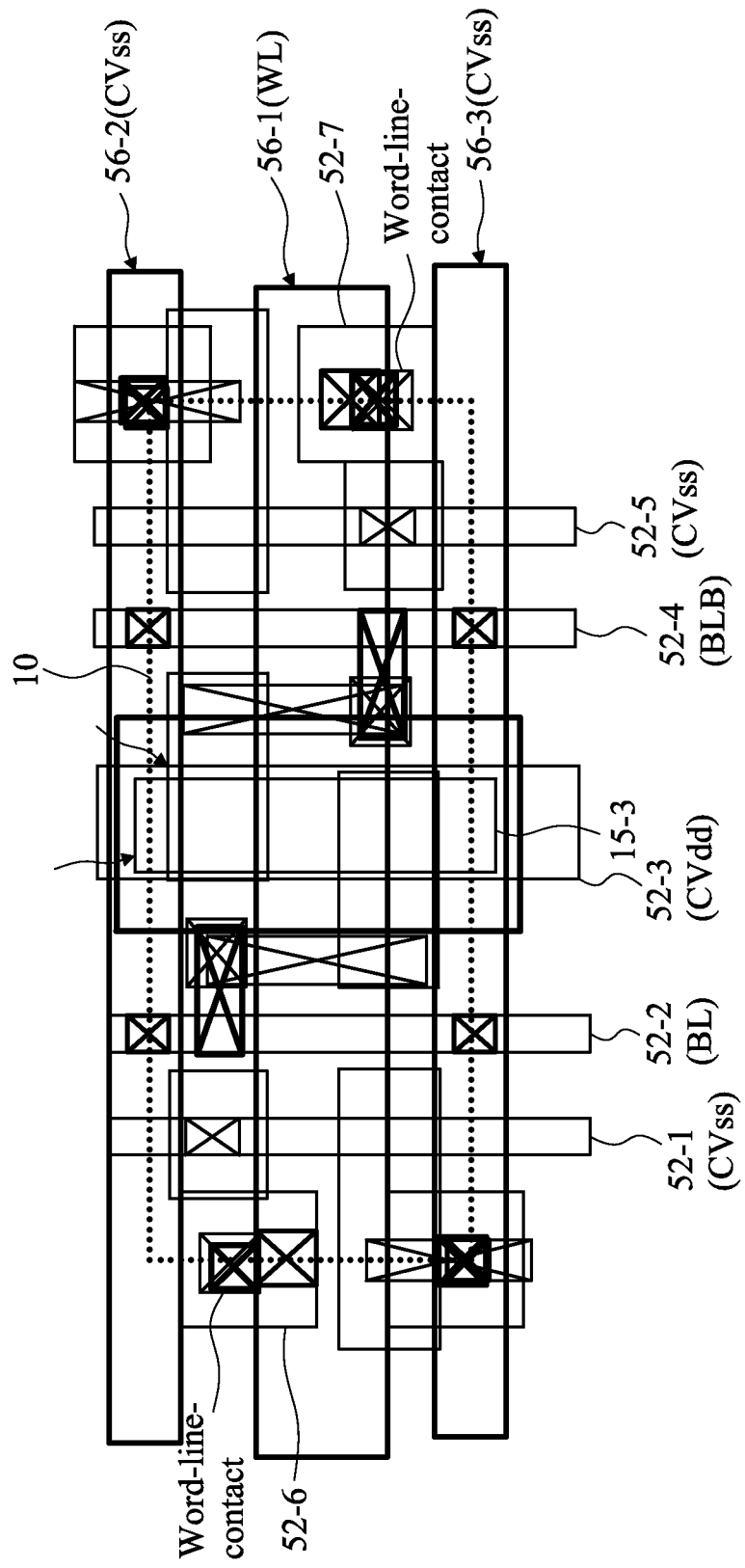

FIG. 11 illustrates the layout of SRAM cell 10 in accordance with alternative embodiments, which are essentially the same as the embodiments in FIG. 10, except that an additional M2 level feature 56-3 is added as an additional power supply CVss, and extends in the row direction. Furthermore, the strip-shaped landing pads 52-6 and 56-7 in FIG. 10 are modified as having a square shape as shown in FIG. 11.

Figure 12:
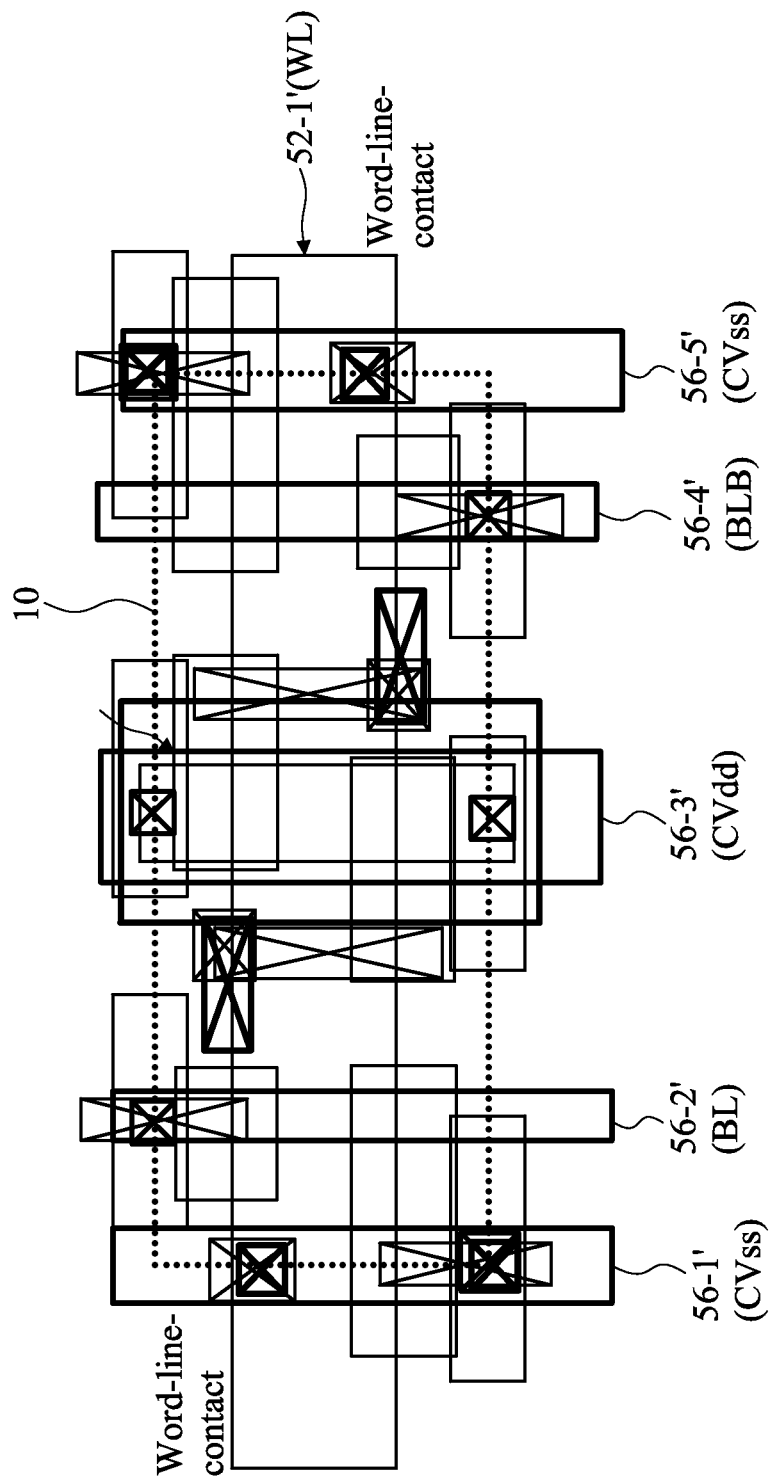

FIG. 12 illustrates the layout of SRAM cell 10 in accordance with yet alternative embodiments. These embodiments differ from the embodiments in FIGS. 10 and 11 in that the M1 level features in FIGS. 10 and 11 are moved to the M2 level in FIG. 12, and the M2 level features in FIGS. 10 and 11 are moved to the M1 level in FIG. 12. For example, FIG. 12 illustrates M2 level metal lines such as 56-1' as a first CVss line, 56-2' as bit-line BL, 56-3' as CVdd line, 56-4' as bit-line bar BLB, and 56-5' as a second CVss line, which extend in the column direction. Word-line 52-1' is provided at the M1 level (refer to FIG. 4), and extends in the row direction.

Figure 13:
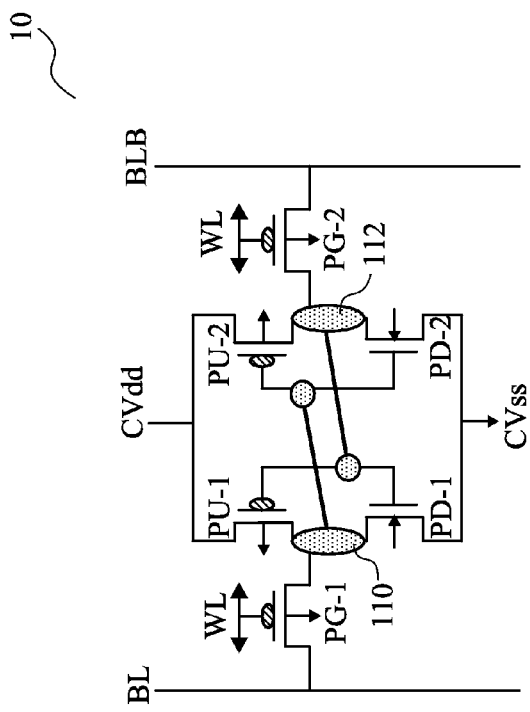
FIGS. 13 and 14 are circuit diagrams of a Static Random Access Memory (SRAM) cell comprising p-type pass-gate transistors in accordance with some embodiments.
Figure 14:
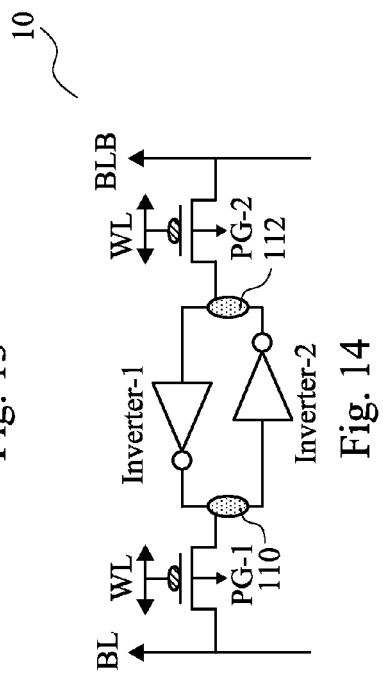

The pass-gate transistors of SRAM cells may use p-type transistors rather than n-type transistors. FIGS. 13 and 14 illustrate the respective circuit diagrams of the SRAM cell 10 in accordance with some embodiments, wherein pass-gate transistors PG-1 and PG-2 are p-type transistors, which are VGAA transistors in accordance with the embodiments of the present disclosure.

Figure 15:
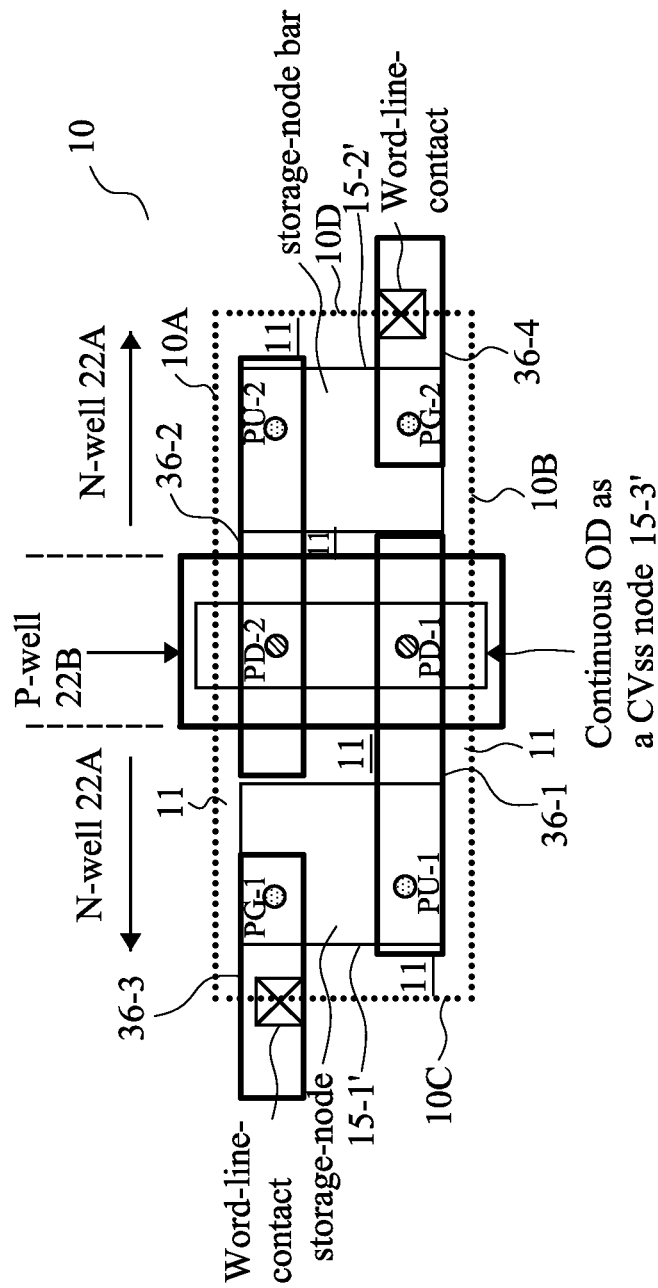
FIG. 15 is an exemplary layout of an SRAM cell comprising p-type pass-gate transistors in accordance with some embodiments.

FIG. 15 illustrates a layout of SRAM cell 10 in accordance with some embodiments. SRAM cell 10 includes P-well 22B in the middle, and N-wells 22A on the opposite sides of P-well 22B. The positions of transistors PD-1 and PU-1 are swapped compared to the layout in FIG. 5, so that transistors PU-1 and PG-1 may be formed on the same OD region 15-1', which acts as storage node 110 (FIG. 13). The positions of transistors PD-2 and PU-2 are also swapped compared to the layout in FIG. 5, so that transistors PU-2 and PG-2 may also be formed on the same OD region 15-2', which acts as storage node 112 (FIG. 13). The continuous OD region 15-3' is shared by transistors PD-1 and PD-2, which is used for carrying power supply voltage CVss, and also acts as the source regions of transistors PD-1 and PD-1. Again, in these embodiments, ODs 15-1' and 15-2' are isolated OD regions not extending to boundaries 10A, 10B, 10C, and 10C of SRAM cell 10. Each of ODs 15-1' and 15-2' is fully encircled by STI regions 11. OD region 15-3', on the other hand, extends to boundaries 10A and 10B of SRAM cell 10.

Figure 16:
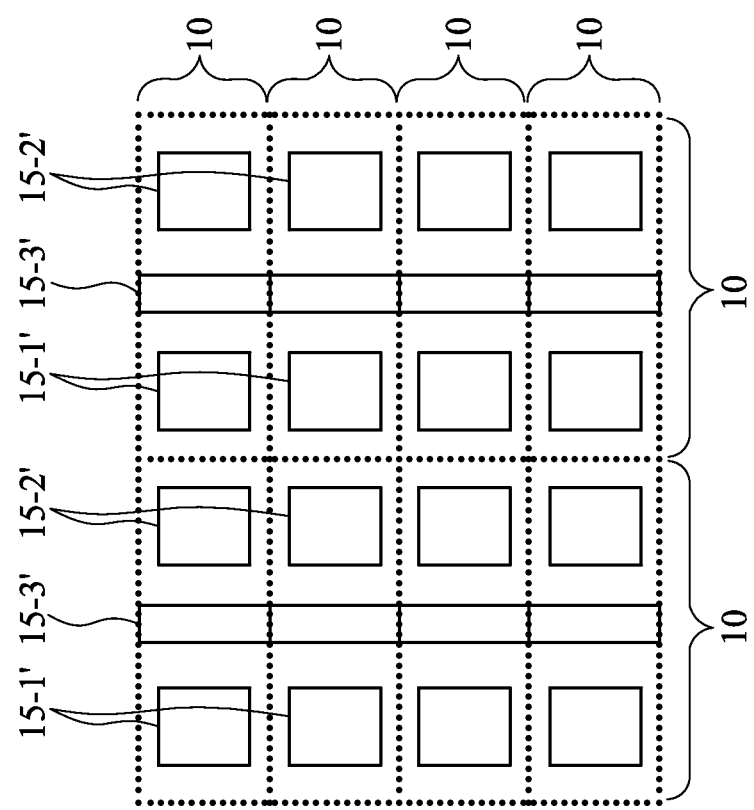
FIG. 16 illustrates an array of SRAM cells comprising p-type pass-gate transistors and the corresponding active regions in accordance with some embodiments.

FIG. 16 illustrates the layout of a plurality of SRAM cells 10 arranged as an array including a plurality of rows and columns, wherein neighboring SRAM cells 10 are butted. OD regions 15-3' form continuous OD regions extending through a plurality of rows in accordance with some embodiments. OD regions 15-1' and 15-2', however, are isolated OD regions.

Figure 17:
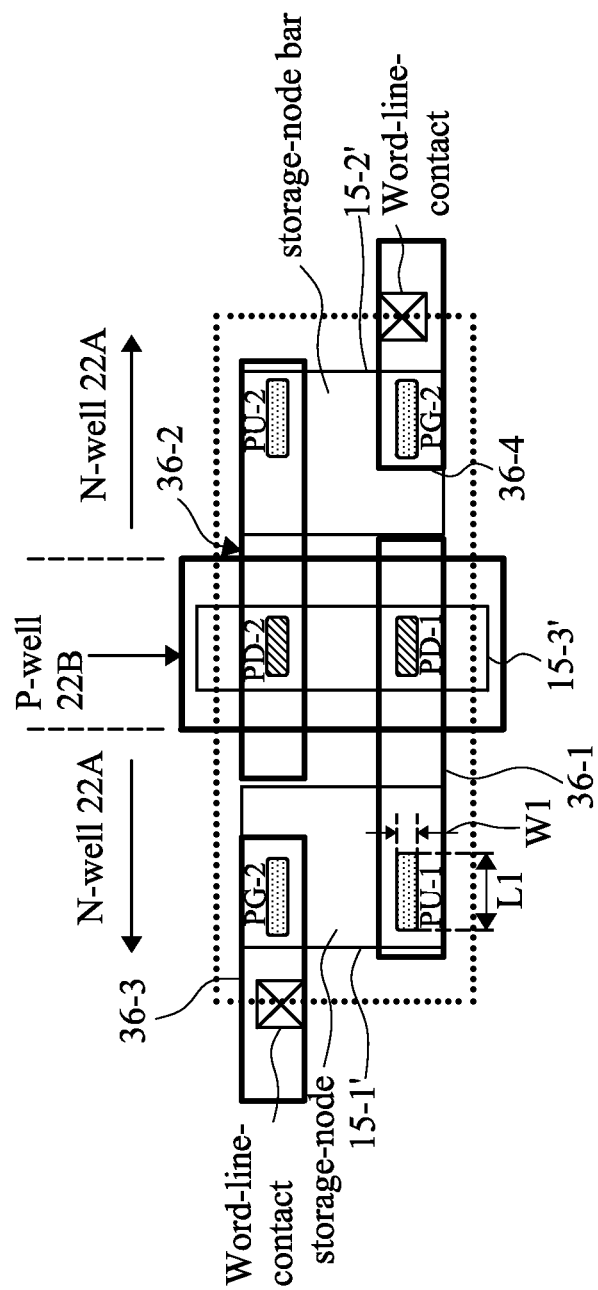
FIG. 17 is a layout of an SRAM cell comprising p-type pass-gate transistors in accordance with some embodiments.

FIG. 17 illustrates a layout of SRAM cell 10 in accordance with alternative embodiments. These embodiments are similar to the embodiments in FIG. 16, except that the top view of the channel regions of transistors PG-1, PG-2, PU-1, PU-2, PD-1, and PD-2 are nano-bars having length L1 significantly greater than the respective widths W1.

The embodiments of the present disclosure have some advantageous features. By adopting the VGAA transistors in SRAM cells, the size of the SRAM cells may be reduced without sacrificing the saturation currents of the transistors in the SRAM cells. OD regions can be used as CVdd or CVss conductors and the common source regions of transistors PU-1 and PU-2 (or PD-1 and PD-2).

In accordance with some embodiments of the present disclosure, an SRAM cell includes a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate as a second source/drain region. A first isolated active region is in the SRAM cell and acts as the bottom plate of the first pull-down transistor and the bottom plate of the first pass-gate transistor. A second isolated active region is in the SRAM cell and acts as the bottom plate of the second pull-down transistor and the bottom plate of the second pass-gate transistor.

In accordance with alternative embodiments of the present disclosure, an SRAM cell includes a first boundary and a second boundary opposite to each other, a first pull-up transistor and a second pull-up transistor, a first pull-down transistor and a second pull-down transistor forming cross-latched inverters with the first pull-up transistor and the second pull-up transistor, and a first pass-gate transistor and a second pass-gate transistor. Each of the first and the second pull-up transistors, the first and the second pull-down transistors, and the first and the second pass-gate transistors includes a bottom plate as a first source/drain region, a channel over the bottom plate, and a top plate as a second source/drain region. A continuous active region extends from the first boundary to the second boundary, wherein the continuous active region acts as both the bottom plate of the first pull-up transistor and the bottom plate of the second pull-up transistor, and acts as a CVdd power node of the SRAM cell.

In accordance with yet alternative embodiments of the present disclosure, an SRAM cell includes a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate as a second source/drain region. A first isolated active region is in the SRAM cell and acts as the bottom plate of the first pull-up transistor and the bottom plate of the first pass-gate transistor. A second isolated active region is in the SRAM cell and acts as the bottom plate of the second pull-up transistor and the bottom plate of the second pass-gate transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) cell comprising:
   a first pull-up transistor and a second pull-up transistor;
   a first pull-down transistor and a second pull-down transistor forming cross-latched inverters with the first pull-up transistor and the second pull-up transistor;
   a first pass-gate transistor and a second pass-gate transistor, wherein each of the first and the second pull-up transistors, the first and the second pull-down transistors, and the first and the second pass-gate transistors comprises a bottom plate as a first source/drain region, a channel over the bottom plate, and a top plate as a second source/drain region over the channel;
   a first isolated active region, wherein the first isolated active region acts as both the bottom plate of the first pull-down transistor and the bottom plate of the first pass-gate transistor; and
   a second isolated active region, wherein the second isolated active region acts as both the bottom plate of the second pull-down transistor and the bottom plate of the second pass-gate transistor.

2. The SRAM cell of claim 1 further comprising:
   a first boundary and a second boundary opposite to each other; and
   a third boundary and a fourth boundary opposite to each other and perpendicular to the first boundary and the second boundary, wherein the first isolated active region is within the SRAM cell, and is spaced apart from the first, the second, the third, and the fourth boundaries.

3. The SRAM cell of claim 1, wherein the first isolated active region is fully encircled by an isolation region.

4. The SRAM cell of claim 1 further comprising:
   a third active region in the SRAM cell, wherein the third active region acts as a source region of the first pull-up transistor and a source region of the second pull-up transistor.

5. The SRAM cell of claim 4 further comprising a first boundary and a second boundary opposite to each other, wherein the third active region extends from the first boundary to the second boundary.

6. The SRAM cell of claim 4, wherein the third active region is a CVdd power node.

7. The SRAM cell of claim 1 further comprising a butted contact connecting the first isolated active region to a gate electrode of the second pull-up transistor and the second pull-down transistor.

8. The SRAM cell of claim 7, wherein the butted contact is further connected to a top plate contact, and the top plate contact is over and contacts the top plate of the first pull-up transistor.

9. A Static Random Access Memory (SRAM) cell comprising:
   a first boundary and a second boundary opposite to each other;
   a first pull-up transistor and a second pull-up transistor;
   a first pull-down transistor and a second pull-down transistor forming cross-latched inverters with the first pull-up transistor and the second pull-up transistor;
   a first pass-gate transistor and a second pass-gate transistor, wherein each of the first and the second pull-up transistors, the first and the second pull-down transistors, and the first and the second pass-gate transistors comprise a bottom plate as a first source/drain region, a channel over the bottom plate, and a top plate as a second source/drain region over the channel; and
   a continuous active region extending from the first boundary to the second boundary, wherein the continuous active region acts as both the bottom plate of the first pull-up transistor and the bottom plate of the second pull-up transistor, and acts as a CVdd power node of the SRAM cell.

10. The SRAM cell of claim 9 further comprising:
    a third boundary and a fourth boundary opposite to each other and perpendicular to the first boundary and the second boundary; and
    a first isolated active region in the SRAM cell, wherein the first isolated active region acts as both the bottom plate of the first pull-down transistor and the bottom plate of the first pass-gate transistor, and acts as a data storage node of the SRAM cell, and wherein the first isolated active region is spaced apart from the first, the second, the third, and the fourth boundaries.

11. The SRAM cell of claim 10 further comprising:
    a second isolated active region in the SRAM cell, wherein the first isolated active region acts as both the bottom plate of the second pull-down transistor and the bottom plate of the second pass-gate transistor, and acts as a complementary data storage node of the SRAM cell, and wherein the first and the second isolated active regions are on opposite sides of the continuous active region.

12. The SRAM cell of claim 9 further comprising:
    a first CVdd metal line over the SRAM cell and connected to the continuous active region;
    a first CVss metal line and a second CVss metal line parallel to, and on opposite sides of, the first CVdd metal line;
    a first bit-line and a second bit-line parallel to, and on opposite sides of, the first CVdd metal line; and
    a word-line perpendicular to the first CVdd metal line, the first and the second CVss metal lines, and the first and the second bit-lines.

13. A Static Random Access Memory (SRAM) cell comprising:
    a first pull-up transistor and a second pull-up transistor;
    a first pull-down transistor and a second pull-down transistor forming cross-latched inverters with the first pull-up transistor and the second pull-up transistor;
    a first pass-gate transistor and a second pass-gate transistor, wherein each of the first and the second pull-up transistors, the first and the second pull-down transistors, and the first and the second pass-gate transistors comprises a bottom plate as a first source/drain region, a channel over the bottom plate, and a top plate as a second source/drain region over the channel;
a first isolated active region, wherein the first isolated active region acts as both the bottom plate of the first pull-up transistor and the bottom plate of the first pass-gate transistor; and
a second isolated active region, wherein the second isolated active region acts as both the bottom plate of the second pull-up transistor and the bottom plate of the second pass-gate transistor.

14. The SRAM cell of claim 13 further comprising:
a first boundary and a second boundary opposite to each other; and
a third boundary and a fourth boundary opposite to each other and perpendicular to the first boundary and the second boundary, wherein the first isolated active region is within the SRAM cell, and is spaced apart from the first, the second, the third, and the fourth boundaries.

15. The SRAM cell of claim 13, wherein the first isolated active region is fully encircled by an isolation region.

16. The SRAM cell of claim 13 further comprising:
a third active region in the SRAM cell, wherein the third active region acts as source regions of both the first pull-down transistor and the second pull-down transistor.

17. The SRAM cell of claim 16 further comprising a first boundary and a second boundary opposite to each other, wherein the third active region extends from the first boundary to the second boundary.

18. The SRAM cell of claim 16, wherein the third active region is a CVss power node.

19. The SRAM cell of claim 13 further comprising a butted contact connecting the first isolated active region to a gate electrode of the second pull-up transistor and the second pull-down transistor.

20. The SRAM cell of claim 19, wherein the butted contact is further connected to a top plate contact, and the top plate contact is over and contacts the top plate of the first pull-up transistor.

* * * * *